United States Patent
Becker et al.

(10) Patent No.: US 7,355,125 B2
(45) Date of Patent: Apr. 8, 2008

(54) PRINTED CIRCUIT BOARD AND CHIP MODULE

(75) Inventors: Wiren D. Becker, Hyde Park, NY (US); Bruce J. Chamberlin, Vestal, NY (US); Roland Frech, Ostfildern (DE); Andreas Huber, Leonberg (DE); George Katopis, Poughkeepsie, NY (US); Erich Klink, Schoenaich (DE); Andreas Rebmann, Schoenaich (DE); Thomas-Michael Winkel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 129 days.

(21) Appl. No.: 11/281,688

(22) Filed: Nov. 17, 2005

(65) Prior Publication Data

US 2007/0109726 A1 May 17, 2007

(51) Int. Cl.
*H05K 1/03* (2006.01)
(52) U.S. Cl. ..................... 174/255; 361/780
(58) Field of Classification Search ............... 174/255, 174/261; 361/792, 780, 306.1, 306.2, 306.3
See application file for complete search history.

(56) References Cited

U.S. PATENT DOCUMENTS

| | | | | |
|---|---|---|---|---|
| 5,912,809 A | * | 6/1999 | Steigerwald et al. | 361/780 |
| 6,596,948 B1 | * | 7/2003 | Haden et al. | 174/262 |
| 6,812,803 B2 | * | 11/2004 | Goergen | 333/1 |
| 2004/0118602 A1 | * | 6/2004 | Lee et al. | 174/260 |

* cited by examiner

*Primary Examiner*—Tuan T. Dinh
*Assistant Examiner*—Yuriy Semenenko
(74) *Attorney, Agent, or Firm*—Lynn L. Augspurger (57) ABSTRACT

The present invention relates to computer hardware design and in particular to a printed circuit board comprising wiring dedicated to supply electric board components such as integrated circuits with at least three different reference planes. In order to provide a printed circuit board having an improved signal return path for basically all relevant signal layers at transitions between card, connector, module and chip while still holding the cross-section structure simple, it is proposed to establish a layer structure wherein
a) a split voltage plane is located adjacent to one side of one of said reference planes and comprises conducting portions for all of said at least three different voltage levels in respective plane parts, and
b) a signal layer being located adjacent to said reference planes.

1 Claim, 7 Drawing Sheets

| MEASURED COUPLED NOISE [mV] | CASE 1 | CASE 2 | CASE 3 |
|---|---|---|---|
| NEAR END | 74 | 67 | 272 |
| FAR END | 14 | 16 | 165 |

Prior Art

PRINTED CIRCUIT BOARD AND CHIP MODULE

BACKGROUND OF THE INVENTION

1. Field of the Invention

The present invention relates to computer hardware design and in particular to a printed circuit board comprising wiring dedicated to supply electric board components such as integrated circuits with at least three different reference planes.

2. Description and Disadvantages of Prior Art

Those reference planes are metallization planes which implement often one ground and two different voltage levels, often denoted as GROUND, Vdd and V3, thus e.g. GND=0 Volt, Vdd=1.8 Volt, and for example an intermediate voltage level V3 as e.g., V3=1.5 Volt. Those printed circuit boards comprise an interface circuit, a single chip module, or a multiple chip module between board and a component, wherein said interface circuit in turn comprises vias for signal wiring and for the supply voltages.

It is useful to differentiate between different packaging levels, where different electrical situations prevail, but which must be electrically connected to each other for operation. Such packaging levels are for instance (in a bottom up view): The chip as a zero packaging level, chip-module as a first packaging level, cards (so called printed wiring boards) carrying different single chip-modules or multiple chip-modules as a second packaging level, or so called mother boards carrying different card connectors with daughter cards as a third level package.

In printed circuit boards of complex computer systems a lot of performance critical high-frequency signals do not stay within one packaging level not even on one card.

Figure 1:
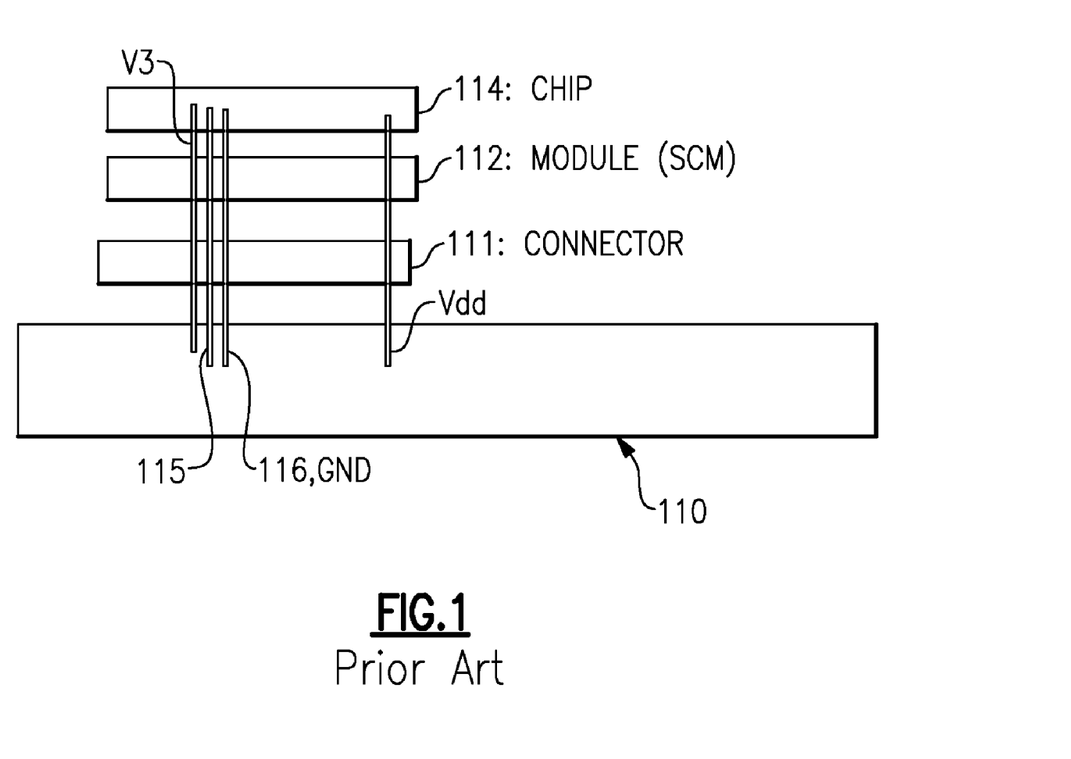
FIG. 1 is a simplified, schematic representation illustrating the structural elements present when a chip is mounted on a circuit board.

With reference to FIG. 1 a card 110 is depicted with a chip module 112 mounted thereon, which in turn acts as a carrier for a chip 114. The high frequency signals often pass the before-mentioned different packaging levels and components like Chip level, Single Chip Modules (SCM) or Multi Chip Modules (MCM), SCM or MCM connectors, card levels, card connectors, back plane boards, etc.

In each of the packaging levels and components signals are referenced to voltage and ground layers, pins or Plated Through Holes (PTH's) adjacent to them. In some applications as depicted in FIG. 1, up to 3 or 4 different voltages V1, V2, and V3 (Ground, and some supply voltages) need to be connected between printed circuit board also referred to herein as "card", and the chip and thus also to the SCM and MCM used in-between. This is schematically depicted in FIG. 1.

With special focus to the present invention high speed digital signals cross the packaging levels in crossing parts, like interconnection vias, or in other structures like bond wires, solder balls, connectors. With increase of digital signal bus speed and fast rise time signal, some small discontinuities like via and non-normal return path on a bus are becoming more important factors for signal quality and timing.

To close the signal return path between a SCM/MCM connector 111 and the card is a special challenge. Usually the signals in the card are referenced to ground (GND) and one of the voltage levels, e.g. voltage 1. If the signal is approaching the module connector the reference can change depending on the voltage and/or ground pin 116 adjacent next to the signal pin 115. In a worst case situation the signal is referenced in the module 112 to just one other voltage, e.g. voltage V2, which is different to the card internal reference plane for this signal. In this case the high frequency signal return path is totally broken. Due to these discontinuities signal coupling will increase dramatically for high frequency signals or signals with a steep signal slope. In order to close the high frequency signal return path and thus limit the signal coupling, a straight forward approach could contain to modify the card cross sections in an appropriate way.

In order to obtain a high-quality signal, an impedance variation should be kept as small as possible in those crossing parts in order to keep the signal distortion as small as possible. Also the discontinuity of the signal return path plays a major role to obtain this goal. The more a return path of the high frequency signal is closed the better is the signal quality. Discrete capacitors mounted on the card surface are not effective for closing the return path due to the large parasitic via inductance. In addition, the high frequency return current is caused by the electromagnetic field surrounding the signal wire. Thus the high frequency return current is directly associated with the electromagnetic field and the signal current. At a discontinuity the electromagnetic field is directly jumping from one reference to the next e.g. power or ground (GND) plane to the module connector plated through hole abbreviated herein as PTH. If there are more signal than power PTHs or ground PTHs, signal coupling will be increased.

With further reference to a publication in IBM Journal of Research and Development, Vol. 48, No. 3/4, published May, July 2004 and FIGS. 2, 3, 4 and 5 (table representation) three exemplary cases of a card-to-card connections are given having different electrical properties in terms of the before-mentioned high-frequency crosstalk problems. In the above publication the technological background for this problem is discussed.

In order to demonstrate the effects of non ideal high frequency signal return path measurements were performed by the authors of above publication on a special card test vehicle (two cards connected with a card connector).

Figure 2:
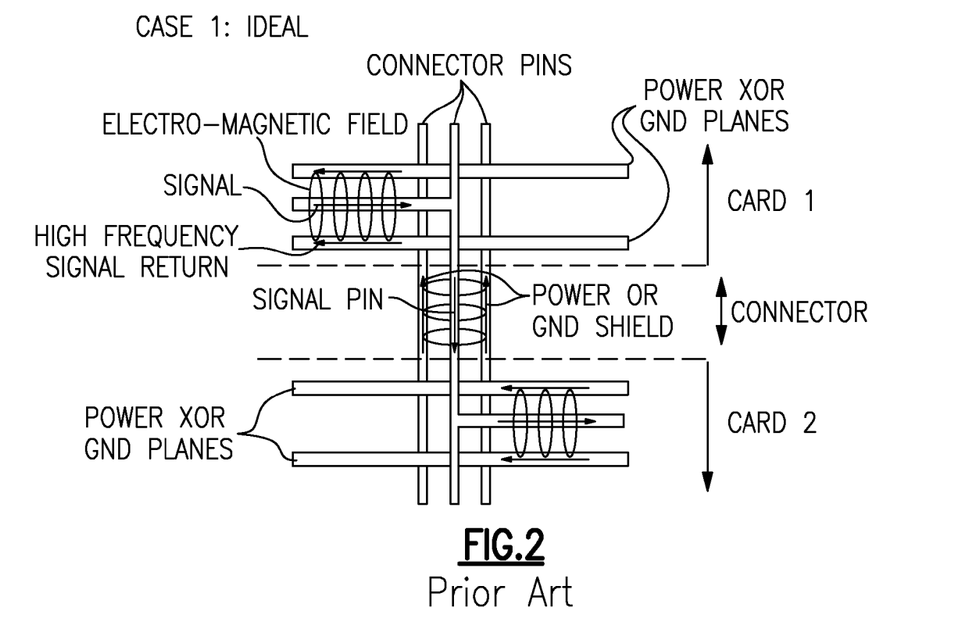
FIG. 2 is a partly cross sectional view including a multi layer structure as given in FIG. 1 and illustrating a signal wiring from a signal layer in card 2 to a signal layer in card 1 crossing the intermediate layers in both cards by a via and the card connector between both cards, illustrating the schematics of the electro-magnetic field around the signal wiring and the associated high frequency signal return path in the layers adjacent to the signal wire, in an ideal case.

FIG. 2 is a partly cross-sectional view including a multi layer structure illustrating a signal wiring from a more top layer to a more bottom layer, crossing the intermediate layers by a via, illustrating the schematics of the electromagnetic field around the signal wiring and the associated high frequency signal return path in the layers adjacent to the signal wire, in an ideal case, wherein the signal wiring is embedded always between two power planes or two ground planes. Here the return path is basically closed all over the signal travel from card 1, over the via of the connector, until reaching card 2, as the signal is embedded always with the same voltage reference (either Ground, or Power).

Figure 3:
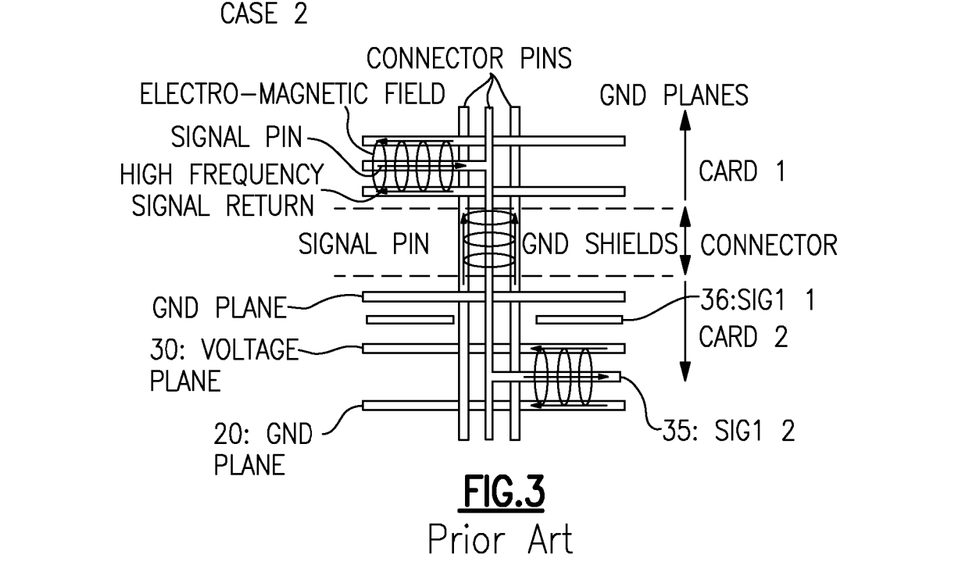
FIG. 3 is a depiction according to FIG. 2 including a voltage plane and an additional signal plane.

FIG. 3 is a depiction according to FIG. 2 including a voltage plane separating signal line 35 and an additional signal plane 36 in the card 2 portion.

In the top portion of card 1 the same good closing of the return path is achieved.

In the bottom portion of card 2 however the signal 36 is embedded between a ground plane 20 and a voltage plane 30. This implies a return path which is slightly worse than in FIG. 2.

Figure 4:
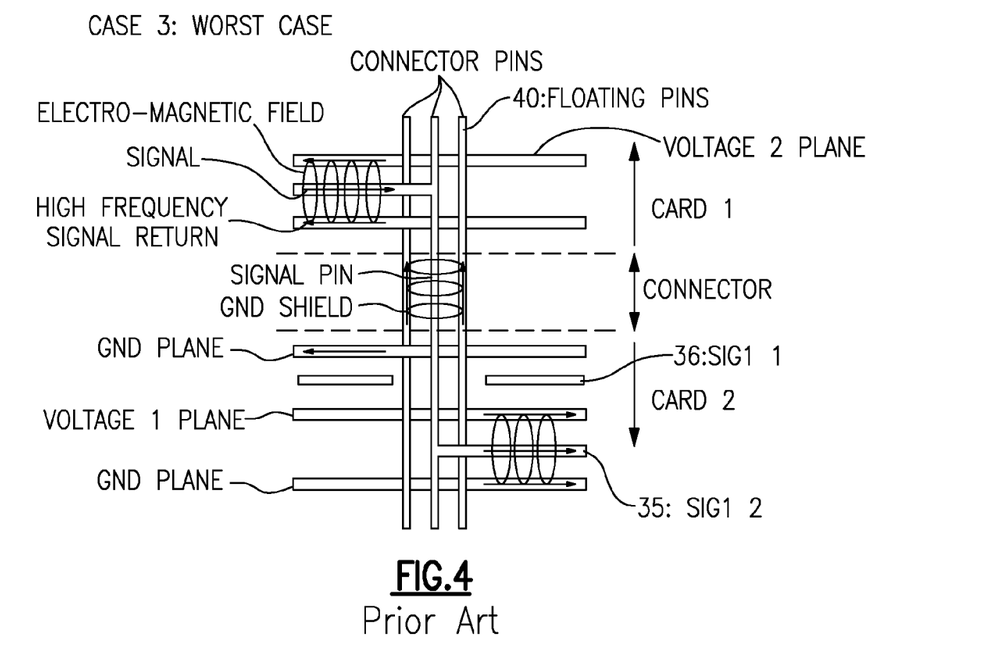
FIG. 4 is a depiction according to FIG. 2 or FIG. 3 illustrating a worst case high frequency signal return path including a floating pin and a resulting high noise coupling.

FIG. 4 is a depiction according to FIG. 3 illustrating a "worst" case high frequency signal return path including a floating pin 40. Floating can be assumed to occur due to the fact that pin 40 is connected to a reference voltage or to Ground in a quite long distance only. From this floating state a high noise coupling results from signal line 36 to signal line 36. The exact results are given in the table of FIG. 5.

Figure 5:
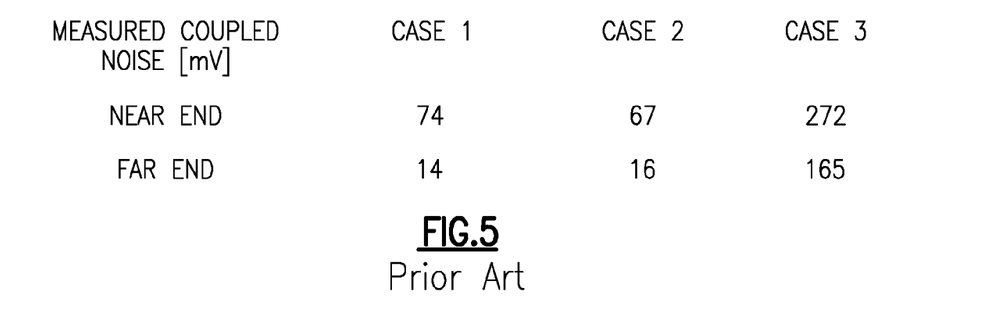
FIG. 5 is a table representation comparing the measurements of coupled noise in mV at the near end and the far end of the signal wiring.

Measurements performed for the case 2 prove that the high frequency return is nearly as good as for the ideal case 1.

In contrast to that measurements performed for the case 3 show a significant increase of coupled noise. In case 3 the floating pin is not connected to any reference plane in card 1 or 2. Therefore the high frequency return current in all other adjacent pins will be increased and thus signal coupling will be increased if the next neighbouring pins are signal pins. In table 1 the near and far end coupling is depicted for all three cases. Near end coupling is to be understood as the coupling which is seen at the launching device, the so called driver circuit in the upper portion of the drawing, and far end coupling as that one that is seen at the receiving device, the so called receiver circuit in the bottom part. In comparison, while the differences in coupling in case 1 and 2 are negligible, the coupling increases significantly in case 3 by a factor of 4 (near end) and 10 . . . 11 for the far end. Usually a floating pin 40 is not used in the system design. From a high frequency return path of view, a module connector pin connected to a voltage or ground plane far away from the internal signal wire connected to the signal pin behaves like a floating pin. This means with increasing distance of the pin (carrying the high frequency return signal) to the power/ground connection, the signal coupling will also increase.

Figure 6:
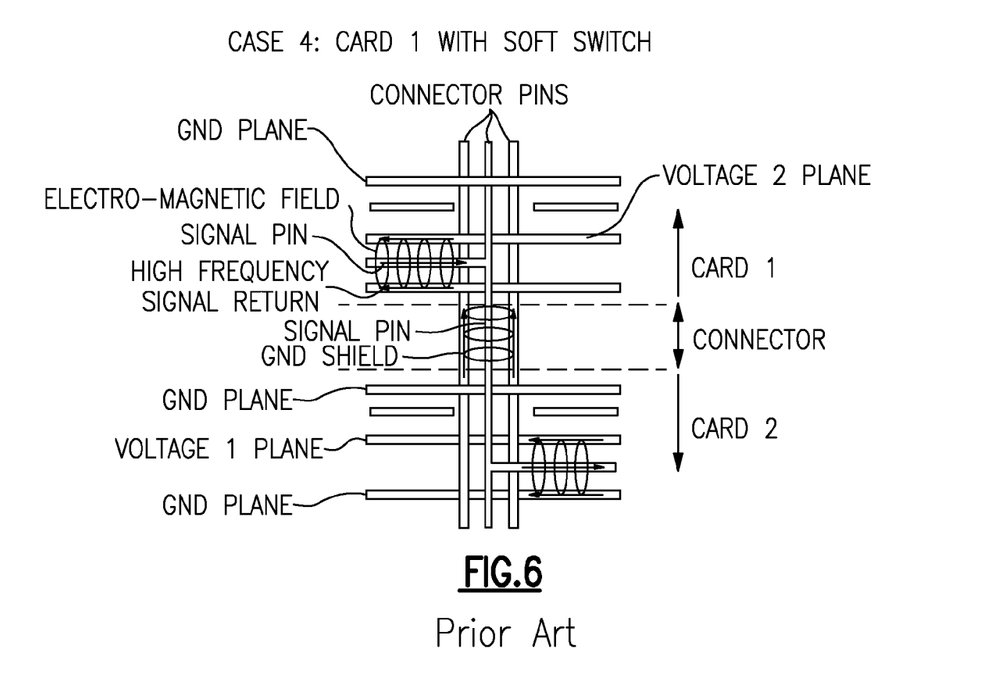
FIG. 6 is a prior art depiction according to FIG. 2 or FIG. 3 illustrating that a soft switch separates the incoming voltage from the card 1 internal voltage for two different voltages, resulting in a bad performance signal return path and a high noise coupling.
Figure 7:
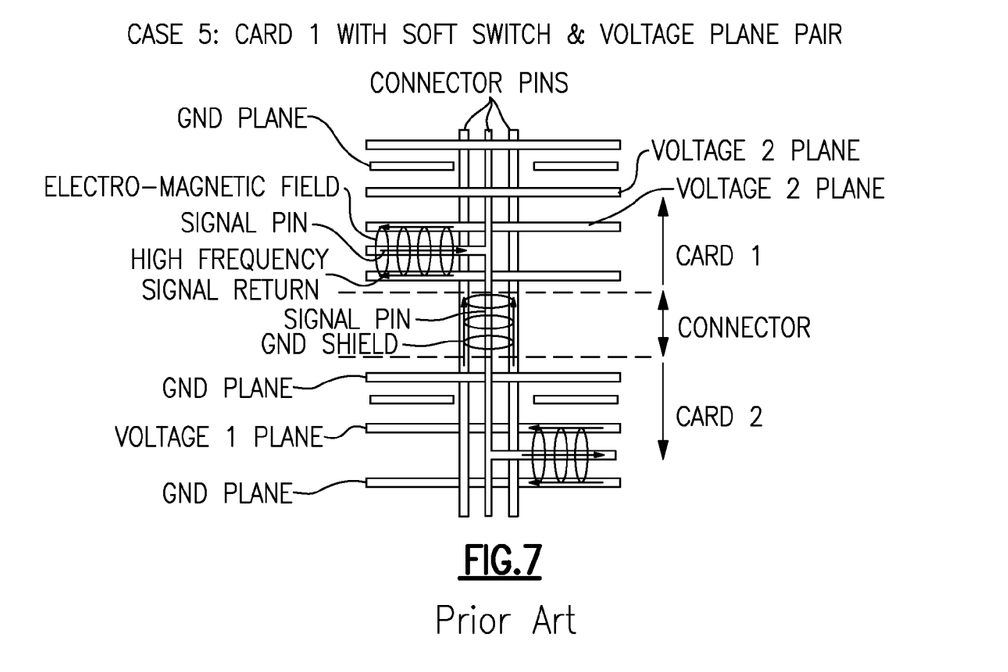
FIG. 7 is a prior art depiction according to FIG. 6 illustrating a prior art high-cost solution for a better signal return path and less coupling.

A further printed circuit board structure is disclosed in a product sold by IBM, available under IBM eServer zSeries z990 product family. It discloses the technical context illustrated in FIGS. 6 and 7. In this disclosure soft switches are mentioned which are used to prevent cards from being damaged by an "over-current". The soft switch separates the card 1 internal voltage 2, FIG. 6, from the source voltage 1 in card 2. The high frequency return path of the signal path, when passing from card 1 to card 2, is said to be broken, which would result in an increased signal coupling. In order to limit the signal coupling it is disclosed to add a second voltage plane as shown in prior art FIG. 7. Thus, a complete plane pair exists having a level of voltage 1 and voltage 2, respectively which is said to limit the impedance mismatch and the signal-to-signal coupling at the card discontinuity and to provide a good high frequency signal return path due to an efficient internal plane capacitance.

This solution is, however, not applicable for cost-driven card designs as the additional plane increases the costs.

Figure 8:
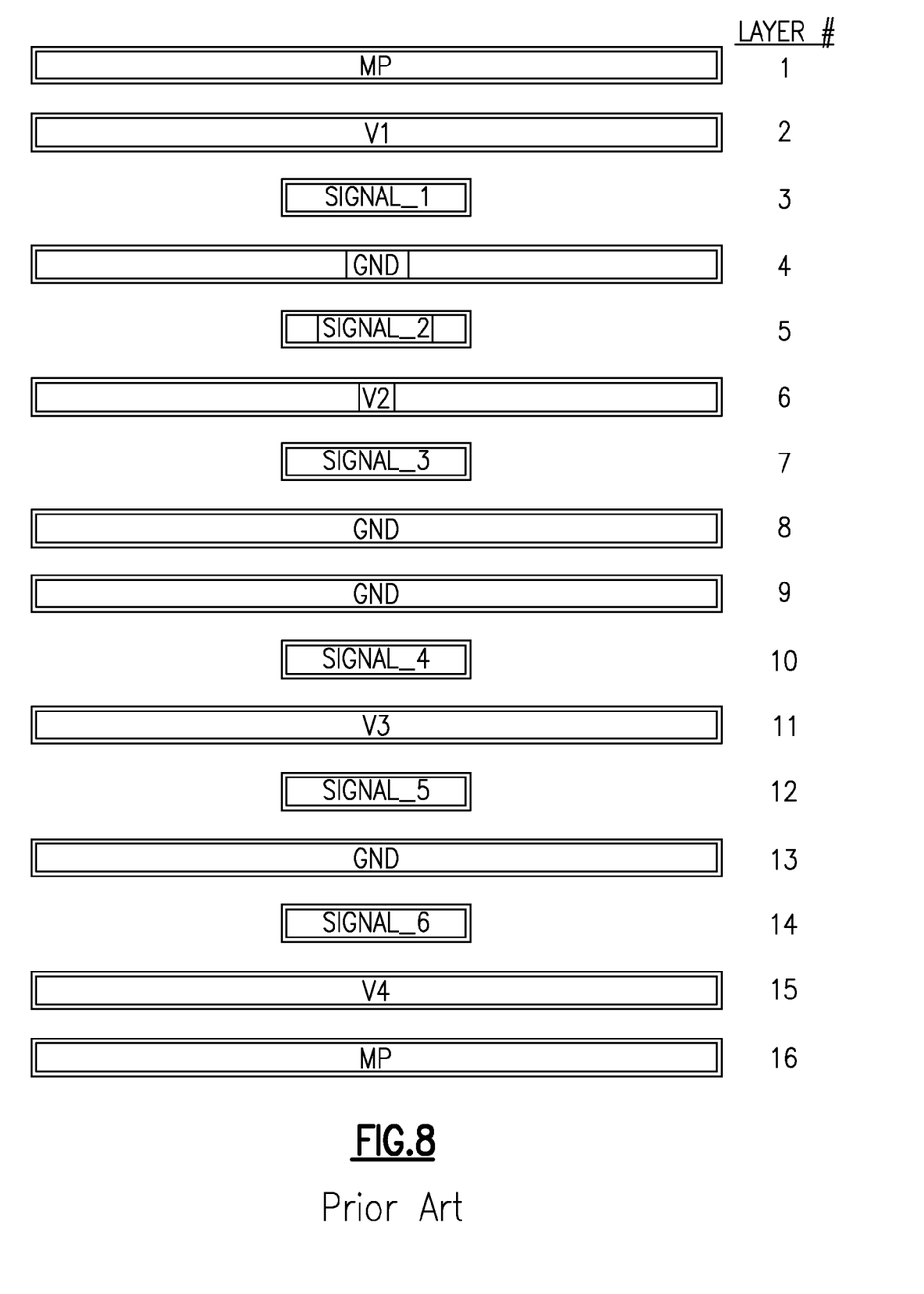
FIG. 8 is a prior art, schematic cross-section representation illustrating the single layers in a card.

Thus keeping in mind the before-mentioned technical problems of signal crosstalk in high frequency digital signals across the different packaging levels, reference will now be made to FIG. 8, which is a prior art, schematic cross-section representation illustrating the single layers in a printed circuit board 110 according to FIG. 1. In FIG. 8 a layer will be identified by reference to its individual layer number, denoted at the right margin of the drawing.

The layer structure given in FIG. 8 is disclosed in the IBM eServer zSeries z9.

In FIG. 8, layers 1 to 16 are depicted. Layer 1 is a mounting plane for mounting electrical components like card-to-card connectors, card to SCM/MCM connectors, SCMs, chip packages and other passive and active electrical components. Under the mounting plane no. 1 connecting from card to e.g. the SCM connector, a layer no. 2 is provided carrying a voltage level V1. This can be a supply voltage of e.g. 1.5 Volt. Beneath that layer a signal layer no. 3 is provided. Beneath layer no. 3, a ground layer no. 4 is located. Then a second signal layer, layer no. 5 is provided followed by a second voltage layer, V2 as layer no. 6. Beneath layer 6 a third signal layer is provided followed by a ground layer, layer no. 8.

Then the same layer sequence is repeated in an inverse manner in order to make the total layer sequence symmetrical to the line defined by both ground layers no. 8, and no. 9. The layer structure ends with the bottom layer 16 which is again a mounting plane for mounting the structure to electrical components like card-to-card connectors, card-to-SCM/MCM connectors, SCMs, chip packages and other passive and active electrical components.

The disadvantage of this layer stack up is that the signals in layers 3, 5, 7, 10, 12, 14 just have dedicated references adjacent to the signal lines. Signals in signal layer 3 are just referenced to V1 and GND, signals in layers 5 and 7 are just referenced to V2 and GND, signals in layer 10 and 12 are just referenced to V3 and GND and signals in layer 14 are just referenced to V4 and GND. If the signals are wired to other electrical components mounted on the card having a different voltage adjacent to the signals and thus a different reference, the high frequency return path is broken causing higher signal crosstalk.

In order to close the high frequency signal return path in the card 10, one would basically need to have at least one signal layer adjacent to each voltage and to GND. This, however, is not a practical solution, because the fan-out of the signal wires in the module area need to be very well controlled which is very time-consuming and therefore expensive. In addition, just one signal layer referenced to one of the voltages might not be enough to fan out all signals. Adding more signal layers with the appropriate voltage reference would however blow up the cross section thickness which increases the costs. Cost-driven card and system designs thus need special design solutions in order to find a well performing design having offering an acceptable trade-off between cost and the optimum electrical design.

OBJECTIVES OF THE INVENTION

It is thus an objective of the present invention to provide a printed circuit board having an improved signal return path for basically all relevant signal layers at transitions between card, connector, module and chip while holding the cross-section structure simple.

SUMMARY AND ADVANTAGES OF THE INVENTION

This objective of the invention is achieved by the features stated in enclosed independent claims. Further advantageous arrangements and embodiments of the invention are set forth in the dependant claims. Reference should now be made to the appended claims.

According to the broadest aspect of the invention a printed circuit board is disclosed, comprising wiring dedicated to supply electric board components, such as integrated circuits with at least three different reference voltage planes, for example one ground and two voltage levels (Gnd, Vdd and V3), and having an interface circuit, e.g. a single chip module, or a multiple chip module, and not necessarily a connector between board and a component, wherein the interface circuit comprises layers and/or vias for signal wiring and for the supply voltages, wherein the interface circuit builds up a board layer stack, characterized in that a) a split voltage plane is located adjacent to one side of one of the reference planes and comprises conducting portions for all of said at least three different voltage levels in respective plane parts, also referred to as "voltage islands", and b) a signal layer being located adjacent to the reference planes.

This solves the objective mentioned above.

When further two respective additional reference plane are located adjacent to both sides of a respective signal layer then the high frequency signal return is even more improved.

When a split voltage plane is located adjacent to two reference planes and comprises conducting portions for all of the at least three different voltage levels in respective plane parts, then the signal return is improved in both directions of the signal layer.

When additionally a signal layer is sandwiched between ground layers then a homogenous signal return current is obtained.

It should be noted that keeping in mind the design goal to be able to "pipe" out each signal from each signal layer from the chip to the card/board through respective vias, the additional split voltage plane acts for providing an increased capacitance for providing an improved signal return path between a signal wiring and the adjacent reference layer at discontinuity locations formed by the vias.

In other words, an important idea of the invention is to add a pre-dimensioned internal plane capacitance with low parasitic in form of a voltage plane "island" sandwiched between ground layers to provide a sufficient high frequency signal return path and thus limit the impedance impact and the signal coupling at the discontinuity.

Figure 10:
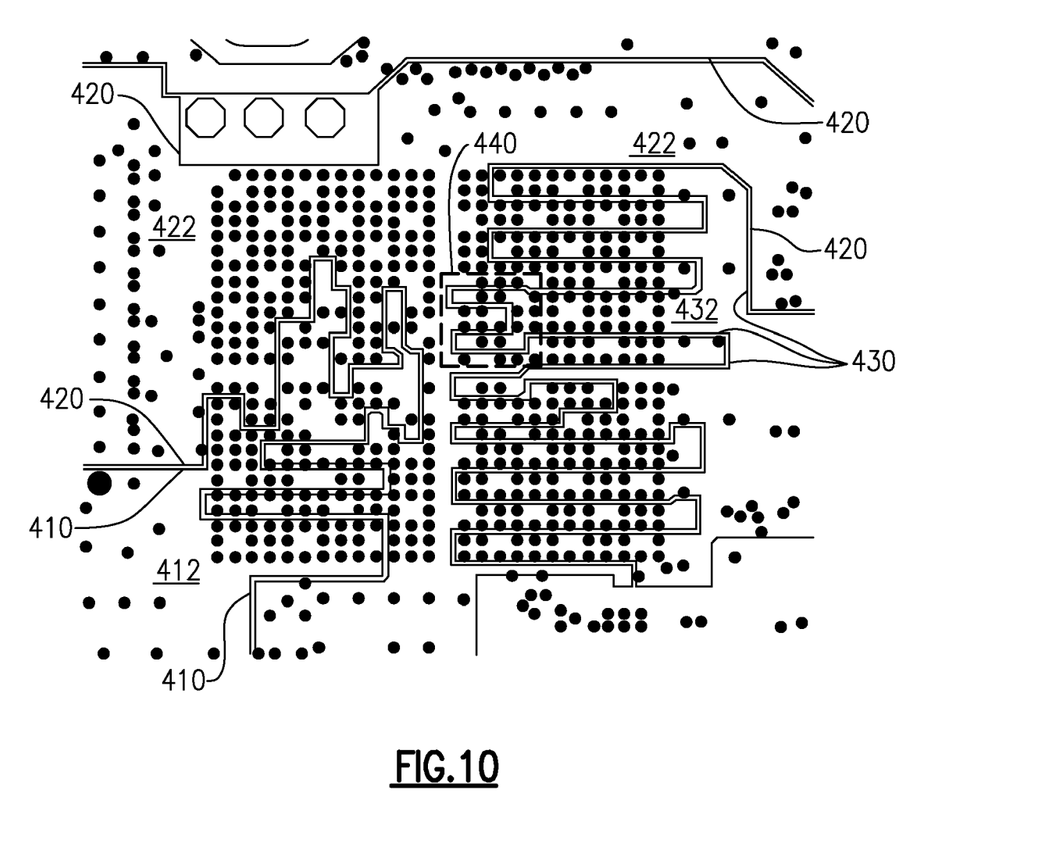
FIG. 10 is a top plan view in a schematic, partial form on layer 302 in FIG. 9 in a simplified schematic form only.

This is achieved by adding buried split voltage planes adjacent to each signal layer. The voltage islands are designed in a way to connect preferably all module voltage pins (as shown in FIG. 10). These split voltage planes are sandwiched between GND layers to avoid signals in adjacent layers running over the voltage splits.

This helps to close the high frequency signal return path, to make all signal layers available for fan out and to avoid signals running over voltage splits. The voltage islands will increase the internal plane to plane capacitance and thus help to close the high frequency return current path.

BRIEF DESCRIPTION OF THE DRAWINGS

The present invention is illustrated by way of example and is not limited by the shape of the figures of the drawings in which.

DETAILED DESCRIPTION OF THE PREFERRED EMBODIMENT

Figure 9:
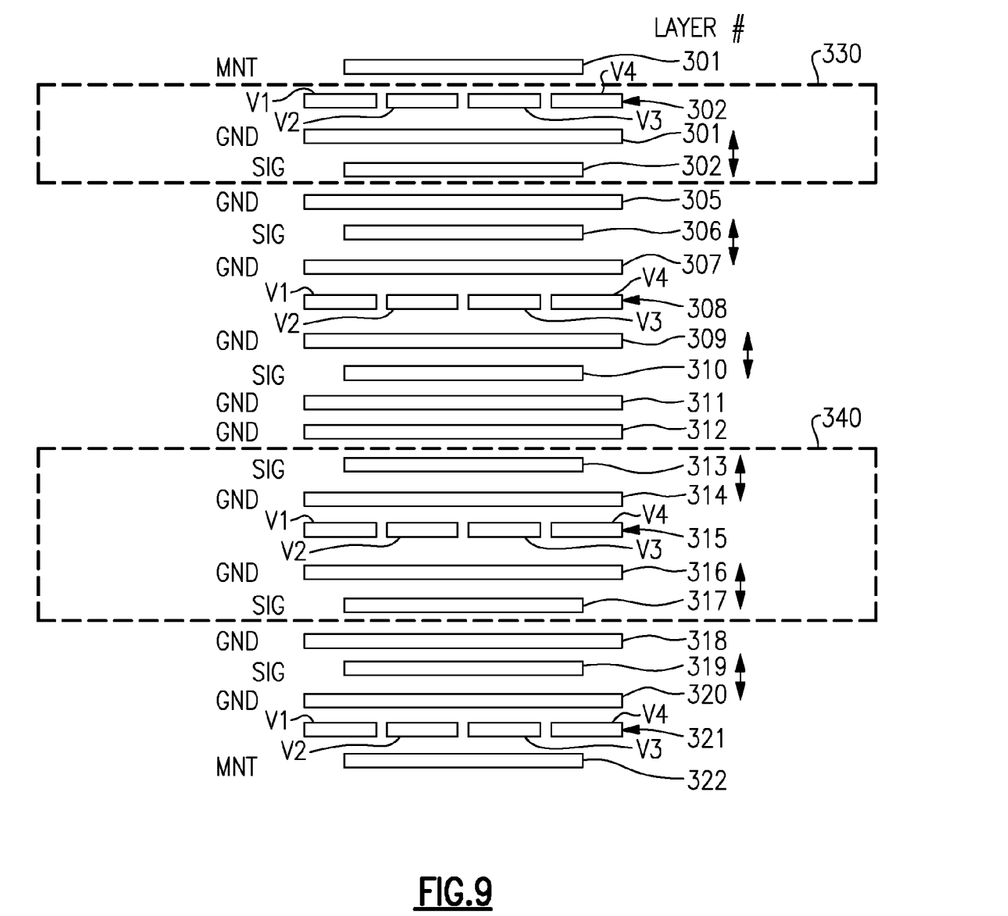
FIG. 9 is a schematic simplified representation according to FIG. 8, implemented according to a preferred embodiment of the present invention.

With additional, special reference to FIGS. 9 and 10 a preferred embodiment of the present invention illustrated with simplified, schematic drawings will be described next below. FIG. 9 shows an example for a cross section for six signal layers in accordance with the present invention.

A layer structure according to this preferred embodiment of the invention comprises a split voltage plane 302 located beneath an upper mounting plane 301. The split voltage plane 302 basically comprises a plurality of four plane parts, each being connected to different voltage levels, denoted as V1, V2, V3 and V4. The actual physical arrangement of the four different plane parts does not reveal from FIG. 9, but instead can be seen in FIG. 10 by way of example. The geometrical shape of the physical arrangement of the plane parts will be described in more detail later below with reference to FIG. 10.

Beneath the split voltage plane 302 a ground plane 303 is located, a layer of conducting material, connected to ground.

Beneath ground layer 303 a signal layer 304 is arranged. In this signal layer many different signal wirings are defined which are placed within the signal layer 304 basically according to prior art.

Under signal layer 304 a second ground layer 305 is located.

Beneath ground layer 305 a second signal layer 306 is located comprising a further wiring arrangement for signals.

Then a third ground layer 307 is arranged beneath signal layer 306.

Beneath ground layer 307 a second, a split voltage plane 308 is arranged having the same or a different geometrical distribution of the four single plane parts belonging to a respective one of the four different voltage levels mentioned already above.

Beneath the split voltage plane 308 a further ground layer 309 is arranged, followed by a further signal layer 310, which is again followed by a further ground layer 311.

By layers 301 to 311 a first half of the layer stack is defined which is repeated in a reversed layer sequence and symmetrically to ground layer 311 in order to form a second half of the layer stack which extends downwardly and comprises the layers 312 to 322. A symmetrical layer structure is a preferable design issue which can be additionally obtained while applying the principles of the present invention.

At the bottom of the layer stack the mounting plane 322 is provided in order to connect the layer structure to electrical components like card to card connectors, card to SCM/MCM connectors, SCMs, chip packages and other passive and active electrical components.

According to the principle of the present invention the advantageous effect of the split voltage planes 302, 308, 315 or 321 is that it helps to increase the capacity between a respective adjacent layer pair 304/303 consisting of a signal layer 304 and a ground layer 303, or the pair 306/307, or pair 309/310, or pair 313/314, or pair 316, 317, or pair 319/320, respectively. Due to this increased capacity, what is indicated by the bi-directional arrows between the above mentioned layer pairs, the respective signal return paths for the respective signal layers 304, 306, 310, 313, 317, 319 is closed for the depicted signal layers. The signal return path always uses the ground layers adjacent to a respective signal layer.

A preferred feature of the present invention depicted in FIG. 9 by the boxes 330 and 340 should thus reveal as follows:

A split voltage layer in accordance with the present invention is located in this embodiment immediately adjacent to a voltage layer next to a signal layer. As reveals from box 330 this principle is followed for the special case of a voltage layer in form of a ground layer, as ground layer 303 for example is a voltage layer having the electrical potential of "ground". Instead of a ground layer, also a layer having some predetermined different electrical potential can be applied. Box 330 illustrates an arrangement of layers wherein the split voltage layer 302 acts in favour to only a single signal layer, here signal layer 304.

As reveals from FIG. 10 within the split voltage plane, for example one of the layers 302, 308, 315 or 321 some contour lines exist, which form the limitation of the shape of a respective plane part, which is in turn supplied with a distinct, predetermined voltage. In more detail contour lines 410 define an internal space 412 surrounded by these lines 410. The surrounded space 412 is the plane part, which is supplied, for example with voltage V1.

Respective further plane parts 422 and 432 are defined by aid of the plane part contour lines 420, and 430, respectively. The shape of the contour lines is adapted to the needs of a respective voltage supply desired for each of the plurality of pins or vias, depicted generally as black circles in FIG. 10.

It should be noted that FIG. 10 represents only a partial view on a split voltage plane under a single chip module (SCM) which is the reason why the plane parts 412, 422 and 432 are not completely surrounded by their respective contour lines. In other words those contour lines continue and their open ends depicted in the drawing connect to each other at some location no more depicted in the drawing of FIG. 10.

What should clearly reveal from the drawing for a person skilled in the art is that the arrangement of the multiple voltage plane parts of the split voltage planes as depicted in FIG. 9 is to be understood only symbolically in FIG. 9, allowing just the note that four different plane parts coexist in one single layer.

So, for example, plane part 412 can be supplied with a voltage V1=0.8V, plane part 422 may be supplied with a supply voltage of 1.2V and plane part 432 may be supplied with a voltage of 1.8V. Of course, a further plane part may coexist so that the arrangement of four different plane parts is realised, as symbolically depicted in FIG. 9.

As reveals from FIG. 10, each one of the plane parts has more or less a shape which is characterized by more or less ramificated sub regions of which one is exemplarily depicted to be located within a frame 440. With reference to the electrical properties desired in such a circuit one design goal is to avoid ramificated sub regions which are too small in width in order to avoid that the metallization of such sub region 440 is mechanically unstable. This would be the case when the width of ramification branch is lower than a minimum width being dependent of the fabrication details of the card.

Preferably, the plane parts 412, 422, 433 have no such fine ramifications or relatively narrow passages connecting between broader sub regions of the same plane part, in order to keep its electrical resistance low.

Keeping in mind the inventive layer structure of FIGS. 9 and 10 the person skilled in the art will appreciate that, since signal wiring is usually very dense in the SCM or MCM module area, all signal layers are needed for the fan out of the signals under the module. The voltage pins can be connected to split internal voltage islands as described exemplarily by sub regions 412, 422, 432 integrated in power planes.

If a split plane is adjacent to a signal plane, then some additional wiring restrictions are needed to avoid signal wires running over voltage split planes.

The solution for this problem is shown in box 340 in FIG. 9. It is to bury the split voltage planes between ground (GND) planes that are not split up.

In more detail, box 340 illustrates a layer arrangement within an inner portion of the layer structure, wherein the split voltage layer 315 acts in a bi-directional sense for signal layer 313 and for signal layer 317. From this example a person skilled in the art may appreciate that it is advantageous to bury the split voltage layer between two ground layers or between two other voltage layers, having a fixed potential and serving to transporting the signal return path of a respective adjacent signal layer, here 313 and 317.

As depicted in FIG. 9, all signal layers 304, 306, 310, 313, 317, and 319 are adjacent on one side to a voltage/ground plane pair. Using such cross section structure including the preferable pattern as depicted within boxes 330 and 340, all signal layers provide the same closed high frequency signal return path. No wiring restrictions are needed for this case.

A person skilled in the art will appreciate that it is recommended to close the signal return path by way of adding such buried split voltage planes adjacent to each signal layer. Thus, some voltage islands are formed, which are preferably designed in a way to connect preferably all module voltage pins (as shown in FIG. 9). These split voltage planes are sandwiched between ground layers to avoid signals in adjacent layers running over the voltage slits. An exception can be made for split voltage layers on top and bottom (layer 2 and 21 in FIG. 9). Here just one GND layer needs to be added.

The same principle can also be applied to mesh planes in single chip modules (SCMs) and multi chip modules (MCMs).

The invention claimed is:

1. A printed circuit board comprising wiring dedicated to supply electric board components with at least three different voltages levels and three respective reference planes each having one ground plane and two voltage planes each having a predetermined voltage level and wherein a voltage plane island is sandwiched between ground layers to provide a high frequency signal return path and to limit impedance impact, said voltage plane island comprising:

a) a split voltage plane is located adjacent to one side of each one of said three reference planes and comprising conducting portions for all of said at least three different voltage levels in respective plan parts, and b) a signal layer is located adjacent to said reference planes and sandwiched between ground layers for signal return path current, wherein the split voltage plane acts for providing an increased capacitance on the signal return path and between a signal path and the adjacent reference layer at discontinuity locations where a signal form a signal layer pipes out to a card via a via, and wherein two additional reference planes are located on both sides of said signal layer for said three reference planes for high frequency signal return, and wherein said split voltage plane is located adjacent to two reference planes and comprises conducting portions for all of said at least three different voltage levels in respective plane parts for signal return in both directions of said signal layer.

* * * * *